(12) United States Patent
Park et al.

(10) Patent No.: US 10,217,836 B2
(45) Date of Patent: Feb. 26, 2019

(54) METHOD OF MANUFACTURING POWER SEMICONDUCTOR DEVICE

(71) Applicant: Magnachip Semiconductor, Ltd., Cheongju-si (KR)

(72) Inventors: Jeong Hwan Park, Gumi-si (KR); Seung Sik Park, Gumi-si (KR); Ha Yong Yang, Cheongju-si (KR)

(73) Assignee: MagnaChip Semiconductor, Ltd., Cheongju-si (KR)

( * ) Notice: Subject to any disclaimer, the term of this patent is extended or adjusted under 35 U.S.C. 154(b) by 3 days.

(21) Appl. No.: 15/686,874

(22) Filed: Aug. 25, 2017

(65) Prior Publication Data

US 2018/0261680 A1    Sep. 13, 2018

(30) Foreign Application Priority Data

Mar. 10, 2017 (KR) .................. 10-2017-0030500

(51) Int. Cl.
*H01L 21/324* (2006.01)
*H01L 29/66* (2006.01)
(Continued)

(52) U.S. Cl.
CPC .. *H01L 29/66348* (2013.01); *H01L 21/02129* (2013.01); *H01L 21/02271* (2013.01);
(Continued)

(58) Field of Classification Search
CPC ............. H01L 29/0619; H01L 29/7397; H01L 29/4236; H01L 29/36; H01L 23/528;
(Continued)

(56) References Cited

U.S. PATENT DOCUMENTS

| 6,809,349 B2 | 10/2004 | Yamaguchi et al. |
| 7,038,273 B2 | 5/2006 | Matsuda |

(Continued)

FOREIGN PATENT DOCUMENTS

| JP | 3288218 B2 | 6/2002 |
| KR | 10-0485855 B1 | 4/2005 |

(Continued)

OTHER PUBLICATIONS

Korean Office Action dated Feb. 22, 2018 in counterpart Korean Patent Application No. 10-2017-0030500 (8 pages, in Korean).

*Primary Examiner* — Shahed Ahmed
(74) *Attorney, Agent, or Firm* — NSIP Law (57) ABSTRACT

A method of manufacturing a power semiconductor device includes forming trenches in a substrate, wherein the substrate includes a first surface and a second surface opposite to the first surface, forming a gate insulating layer and a gate electrode in each of the trenches, forming a P-type base region between the trenches in the substrate, performing a first implantation process using P-type dopants implanted onto the P-type base region, forming an N+ source region in the substrate, forming an interlayer insulating layer on the N+ source region, performing a second implantation process using P-type dopants to form a P+ doped region on the P-type base region, forming an emitter electrode in contact with the N+ source region and the P+ doped region, forming a P-type collector region on the second surface of the substrate, and forming a drain electrode on the P-type collector region.

20 Claims, 11 Drawing Sheets

(51) Int. Cl.
*H01L 21/265* (2006.01)
*H01L 29/36* (2006.01)
*H01L 21/304* (2006.01)
*H01L 21/02* (2006.01)
*H01L 29/45* (2006.01)
*H01L 29/06* (2006.01)
*H01L 29/08* (2006.01)
*H01L 29/417* (2006.01)
*H01L 29/10* (2006.01)
*H01L 29/423* (2006.01)

(52) U.S. Cl.
CPC ...... *H01L 21/26513* (2013.01); *H01L 21/304* (2013.01); *H01L 21/324* (2013.01); *H01L 29/0696* (2013.01); *H01L 29/36* (2013.01); *H01L 29/45* (2013.01); *H01L 29/0821* (2013.01); *H01L 29/0865* (2013.01); *H01L 29/1004* (2013.01); *H01L 29/1095* (2013.01); *H01L 29/41708* (2013.01); *H01L 29/41741* (2013.01); *H01L 29/4236* (2013.01)

(58) Field of Classification Search
CPC . H01L 29/402; H01L 29/407; H01L 29/4238; H01L 29/1095; H01L 29/66348; H01L 21/02129; H01L 21/02271; H01L 21/26513; H01L 21/304; H01L 21/324
See application file for complete search history.

(56) References Cited

U.S. PATENT DOCUMENTS

| | | | |
|---|---|---|---|
| 7,078,740 | B2 | 7/2006 | Yamaguchi et al. |
| 2003/0201455 | A1* | 10/2003 | Takahashi ........... H01L 29/0692 257/136 |
| 2015/0325558 | A1* | 11/2015 | Hikasa ................. H01L 29/16 257/49 |
| 2016/0043073 | A1* | 2/2016 | Tamura ............... H01L 27/0664 257/140 |
| 2016/0240638 | A1* | 8/2016 | Ikura .................. H01L 29/7397 |
| 2017/0309574 | A1* | 10/2017 | Yamada ............. H01L 23/53295 |
| 2017/0338307 | A1* | 11/2017 | Yilmaz .............. H01L 29/66348 |
| 2017/0352595 | A1* | 12/2017 | Li ....................... H01L 21/0257 |

FOREIGN PATENT DOCUMENTS

| KR | 10-0512646 B1 | 9/2005 |
|---|---|---|
| KR | 10-2016-0133625 A | 11/2016 |

\* cited by examiner

METHOD OF MANUFACTURING POWER SEMICONDUCTOR DEVICE

CROSS-REFERENCE TO RELATED APPLICATIONS

This application claims the benefit under 35 USC 119(a) of Korean Patent Application No. 10-2017-0030500 filed on Mar. 10, 2017 in the Korean Intellectual Property Office, the entire disclosure of which is incorporated herein by reference for all purposes.

BACKGROUND

1. Field

The following description relates to a method of manufacturing a power semiconductor device. The following description also relates to a method of manufacturing a power semiconductor device that manages breakdown voltage effectively and reduces gate capacitance by reducing the power of an electric field (E-field) compared to an alternative power semiconductor device by the improvement of a structure of an Injection Enhanced Gate Transistor (IEGT) and, accordingly, reduces energy consumption and improves the performance of switching.

2. Description of Related Art

In the field of power electronics, there is a strong demand for miniaturization and high performance of power supply devices. To meet these demands, power semiconductor devices have been improved in performance for providing low loss and low noise as well as to be able to withstand high voltage and large currents. Under such circumstances, an IEGT that is made by improving an Insulated Gate Bipolar Transistor (IGBT) has been attracting attention as a device having a low ON voltage characteristic and being capable of reducing a turn-off loss simultaneously.

In particular, in order to secure a Breakdown Voltage Collector-Emitter, specified with a zero gate emitter voltage ($BV_{CES}$) of an IEGT, alternative technologies recently publicized minimize a floating interval of the IEGT or increase a resistivity value of an Epi layer and secure the $BV_{CES}$ that is the breakdown voltage between the collector and the emitter.

However, such alternative technologies have had problems of increasing Collector-Emitter Saturation Voltage ($V_{ce}$(sat)) by reducing a floating effect or of reducing switching performance by increasing the thickness of the Epi Layer.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a method of manufacturing a power semiconductor device includes forming trenches in a substrate, wherein the substrate includes a first surface and a second surface opposite to the first surface, forming a gate insulating layer and a gate electrode in each of the trenches, forming a P-type base region between the trenches in the substrate, performing a first implantation process using P-type dopants implanted onto the P-type base region, forming an N+ source region in the substrate, forming an interlayer insulating layer on the N+ source region, performing a second implantation process using P-type dopants to form a P+ doped region on the P-type base region, forming an emitter electrode in contact with the N+ source region and the P+ doped region, forming a P-type collector region on the second surface of the substrate, and forming a drain electrode on the P-type collector region.

The method of manufacturing a power semiconductor device may further include forming a floating region and an N-type well region in the substrate.

The substrate may include a high-concentration first epitaxial-layer and a low-concentration second epitaxial-layer.

The P+ doped region may have a greater depth than a depth of the N+ source region.

The N+ source region and the P+ doped region may each contact a sidewall of the emitter electrode.

The method of manufacturing a power semiconductor device may further include performing a rapid thermal process after performing the first implantation process, and performing a grinding process on the second surface of the substrate, before forming the collector region.

An ion implantation energy of the first implantation process may be greater than an ion implantation energy of the second implantation process.

A dose amount of the second implantation process may be smaller than a dose amount of the first implantation process.

The interlayer insulating layer may include two stacked layers.

A first layer of the interlayer insulating layer may be a Chemical Vapor Deposition (CVD) oxide layer, and a second layer of the interlayer insulating layer may be one of phosposilicate glass (PSG) and borophosphosilicate glass (BPSG).

The emitter electrode may be formed of aluminum (Al), copper (Cu), or an aluminum/copper (Al/Cu) alloy.

In another general aspect, a method of manufacturing a power semiconductor device includes forming trenches in a substrate including a first surface and a second surface opposite to the first surface, forming a gate insulating layer and a gate electrode in each of the trenches, forming a P-type base region in the substrate, forming a P+ doped region and a N+ source region in the P-type base region, forming an interlayer insulating layer on the P+ doped region and the N+ source region, forming an interlayer insulating layer pattern on the gate electrode, and subsequently performing a compensation process, forming an emitter electrode contacting the N+ source region, forming a collector region on the second surface of the substrate, and forming a drain electrode on the collector region.

The method of manufacturing a power semiconductor device may further include performing a rapid thermal process after forming the P+ doped region.

The compensation process may include performing an implantation process, using P-type dopants, into the P+ doped region.

A portion of the P+ doped region contacting a sidewall of the emitter electrode may be larger than a portion of the N+ source region contacting the sidewall of the emitter electrode.

The interlayer insulating layer may include two stacked layers.

A first layer of the interlayer insulating layer may be a Chemical Vapor Deposition (CVD) oxide layer, and a second layer of the interlayer insulating layer may be one of phosposilicate glass (PSG) and borophosphosilicate glass (BPSG).

The emitter electrode may be formed of aluminum (Al), copper (Cu), or an aluminum/copper (Al/Cu) alloy.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Expressions such as "first conductivity type" and "second conductivity type" as used herein may refer to opposite conductivity types such as N and P conductivity types, and examples described herein using such expressions encompass complementary examples as well. For example, an example in which a first conductivity type is N and a second conductivity type is P encompasses an example in which the first conductivity type is P and the second conductivity type is N.

Hereinafter, examples are described in detail with reference to the accompanying drawings.

In the method of manufacturing power semiconductor device according to examples, the ion implantation energy and dose amount of the formation of the second P+ doped region are smaller than the ion implantation energy and dose amount used for forming the first P+ doped region.

The method of manufacturing power semiconductor device according to the examples is directed to providing a semiconductor device that can provide low $V_{ce}(sat)$ and an improved switching performance without a reduction of $BV_{CES}$ by reducing an electric field concentrated on the underside of the trench structure by forming a floating region deeper than usual to encompass the underside of the trench structure.

Thus, this disclosure is provided to introduce a method of manufacturing a power semiconductor device that is able to maintain $BV_{CES}$, reduce gate capacitance, and accordingly provide improved switching performance with less power energy consumption.

Hereinafter, in FIG. 1 to FIG. 12, a method of manufacturing a power semiconductor device according to an example and a power semiconductor device manufactured thereby are described in further detail.

Figure 1:
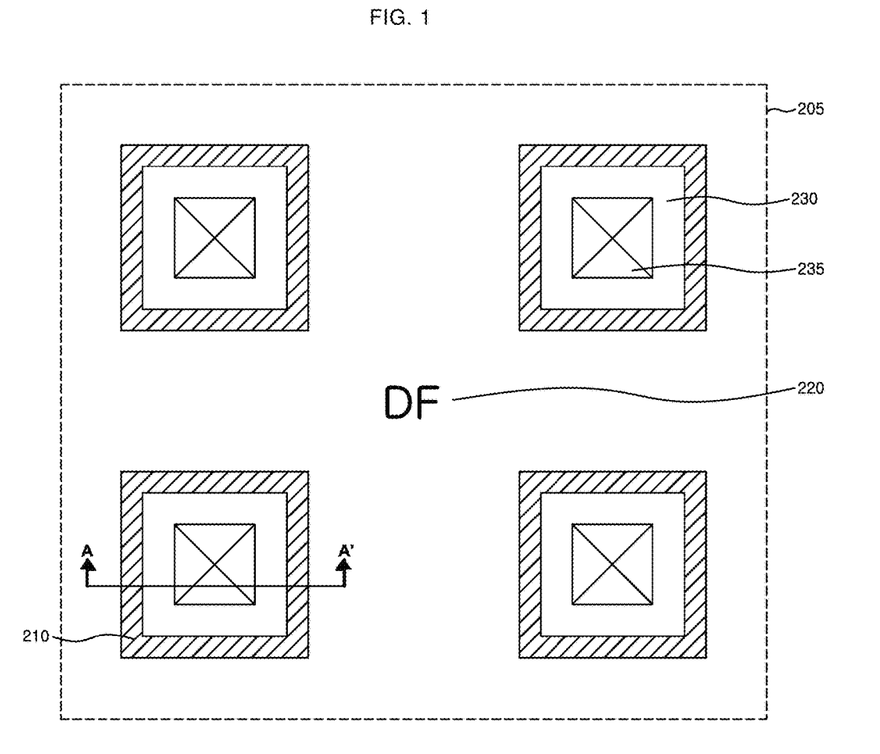
FIG. 1 is a top view of a power semiconductor device according to an example.

FIG. 1 is a top view of a power semiconductor device according to an example.

The power semiconductor device includes tens and hundreds of active cell regions 205. One unit active cell region 205 includes N+ source region 230 and a P+ doped region 235, wherein the N+ refers to a high doping concentration of N-type dopants, and P+ also refers to a high doping concentration of P-type dopants. In such an example, the N+ source region 230 surrounds the P+ doped region 235. Also, the power semiconductor device includes trench gate structures 210 surrounding the N+ source region 230 and the P+ doped region 235. A P-type floating region (DF) 220 is formed between each of the trench gate structures 210 and the other trench gate structures 210. The floating region 220 is not electrically connected to the emitter electrode or the gate electrode, and is thus entirely in a floating state.

Figure 2:
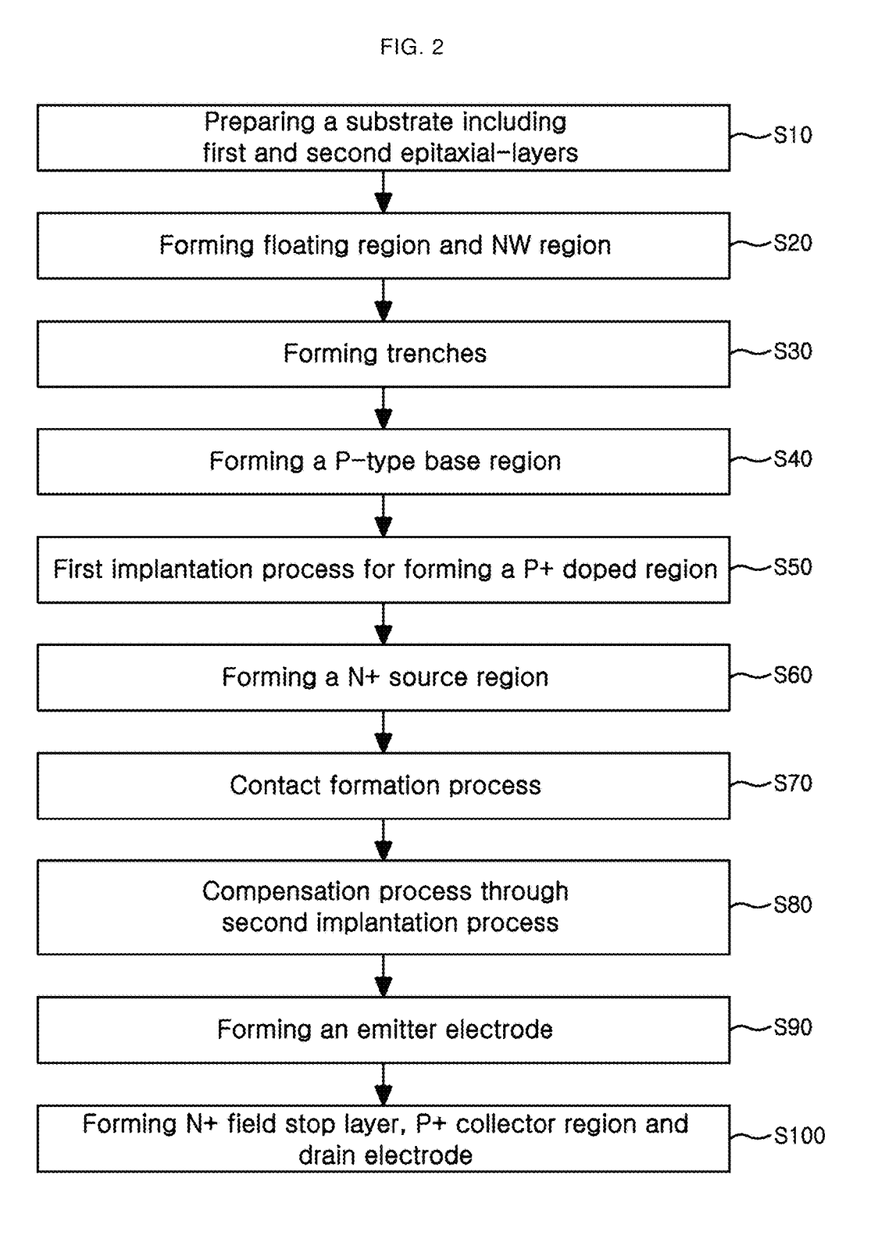
FIG. 2 is a flow chart of a power semiconductor device according to an example.

FIG. 2 is a flow diagram for fabrication of a power semiconductor device according to an example. At operation S10, a substrate including a first epitaxial-layer 250 and a second epitaxial-layer 252 is prepared. The second epitaxial-layer is used as electric field stop layer. In the example of FIG. 2, the first epitaxial-layer is used as a drift region. At operation S20, a floating region and an N-type well region are formed in the first epitaxial-layer. At operation S30, trenches are formed in the substrate and a gate insulating layer and a gate electrode are formed in each of the trenches. At operation S40, a P-type base region is formed in the substrate. Operation S50 is a first implantation process to form a P+ doped region. At operation S60, an N+ source region is formed. Operation S70 is a contact formation process to open a top surface of the substrate. Operation S80 is a compensation process to compensate P-type dopants in the P+ doped region using a second implantation process. In further detail, operation S80 is an operation of forming a second P+ doped region in the first P+ doped region. In an example, the ion implanting energy and dose amount of forming the second P+ doped region are smaller than the ion implanting energy and dose amount of forming the first P+ doped region.

At operation S90, an emitter electrode and a passivation layer are formed. The emitter electrode contacts the N+ source region and the P+ doped region. Also, at operation S100, a back side grinding operation is performed on the rear surface of the substrate to remove a portion of the substrate until the N+ field stop layer is exposed. Additionally, a P+ collector layer 257 is formed. Furthermore, a power semiconductor device is completed by forming a drain electrode 259.

Figure 3:
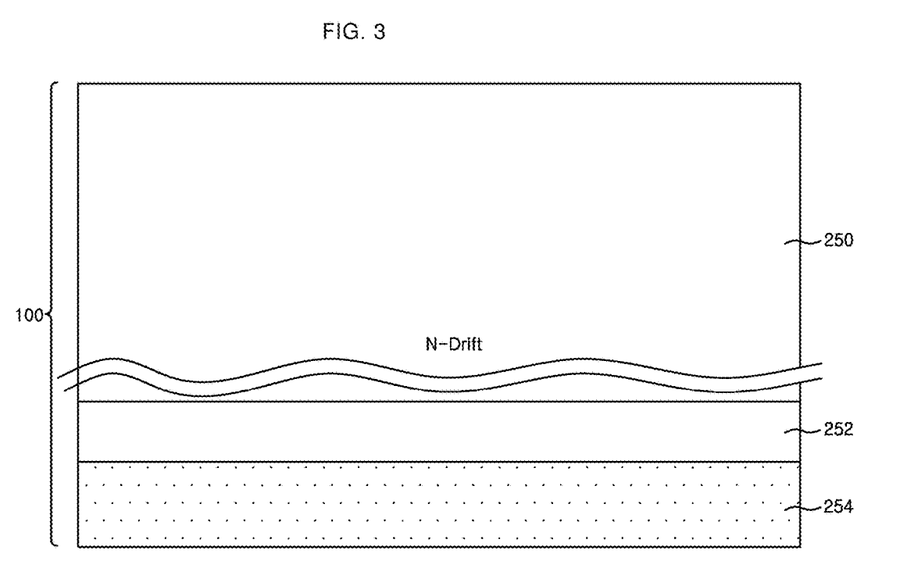
FIGS. 3 to 10 are drawings illustrating a power semiconductor device according to an example.
Figure 9:
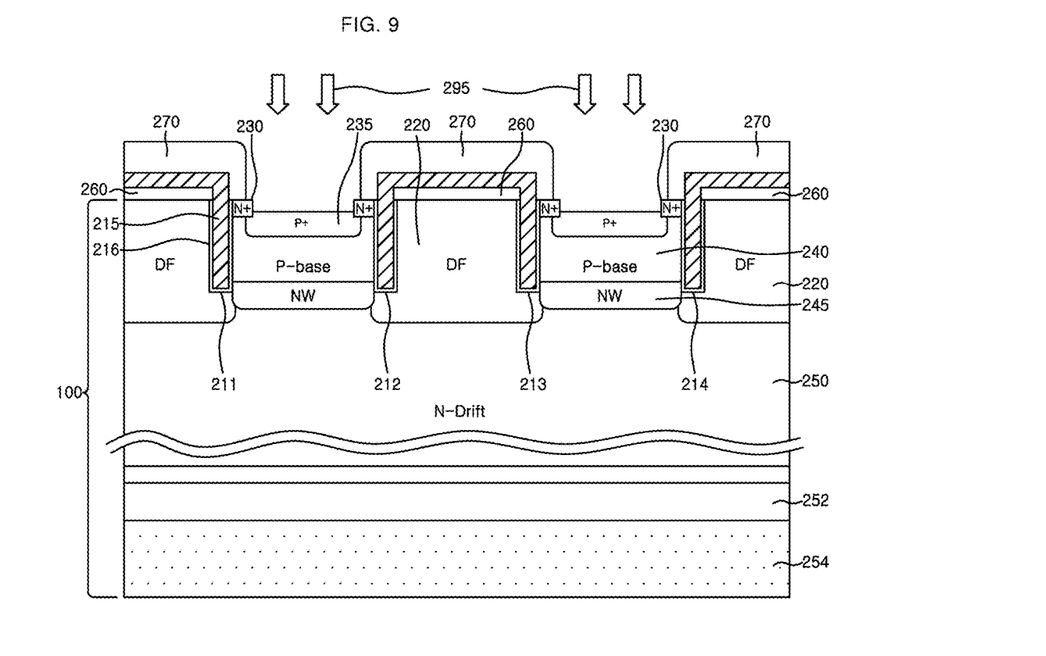
Figure 10:
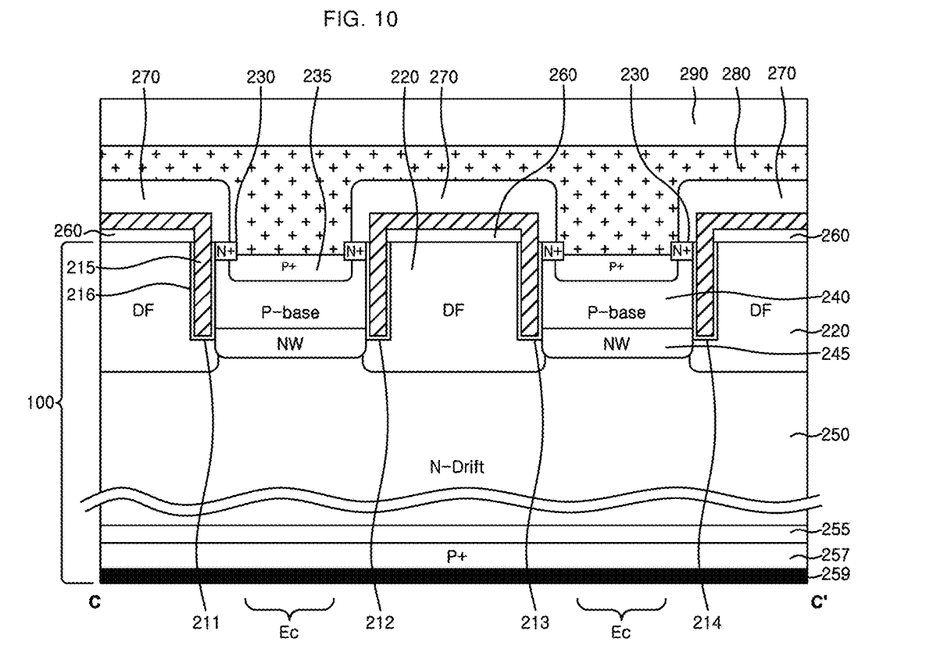

First, as illustrated in the example of FIG. 3, the substrate 100 includes a first epitaxial-layer 252 doped with high-concentration N-type dopant and a second epitaxial-layer 250 doped with low-concentration N-type dopant on the base substrate 254. In such an example, two epitaxial-layers 252, 250 having different concentrations from each other are formed. In this example, the first epitaxial-layer 252 with a high concentration of impurities operates as a field stop layer, or a buffer layer, as shown in FIGS. 9-10, with reference to buffer layer 255. The second epitaxial-layer 250 operates as a drift region 250, which is explained further hereinafter.

The thickness of the second epitaxial-layer 250 may be 90~100 um. A reason for forming the second epitaxial-layer 250 to be thick in this manner is to separate the floating region 220 from the first epitaxial-layer 252, which will be formed subsequently, by a predetermined distance. Through this approach of using the specified thicknesses, it becomes possible to increase breakdown voltage for the power semiconductor device by securing a certain distance between the first epitaxial-layer 252 and the base region 240 or the floating region 210.

Figure 4:
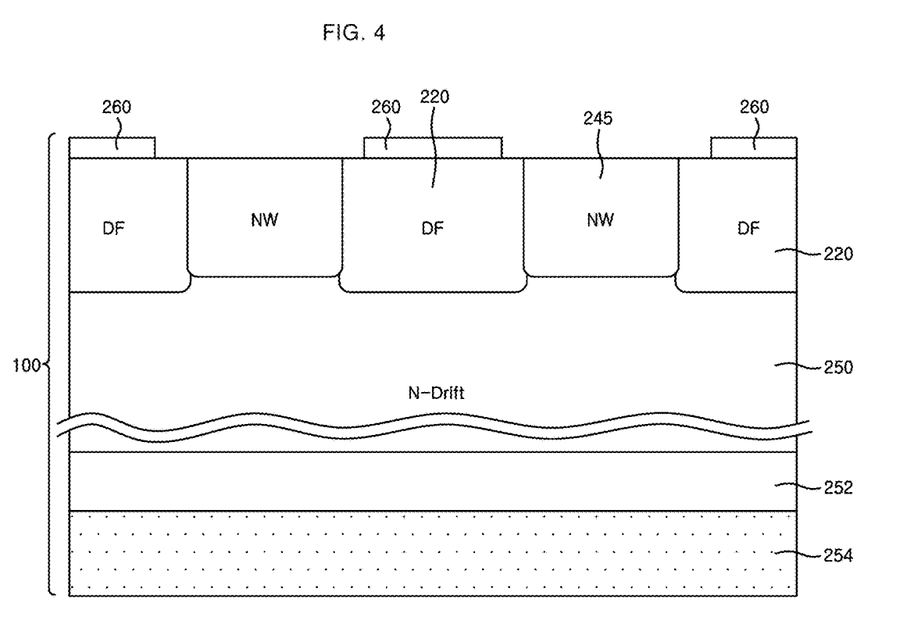

Then, as illustrated in the example of FIG. 4, a P-type floating region DF 220, a Local Oxidation of Silicon (LOCOS) layer 260 and an N-type well region 245 are formed in the substrate.

More specifically, floating mask patterns are formed to be separated apart at regular intervals on the substrate. Also, floating regions 220 are formed by ion implantation of a P-type dopant in the substrate. For example, as such a P-type dopant, boron (B) or boron difluoride (BF2) may be used. However, these are only examples, and other P-type dopants are used in other examples. For example, the floating regions 220 are formed to have a depth of 8-9 um. With respect to securing the breakdown voltage, the depth of the floating region 220 is potentially about 8 to 10% of the thickness of the N-type drift region 250. For example, the floating region 220 may be formed with a greater depth as compared to the well region 245.

A LOCOS 260 region is formed in the substrate 100. This LOCOS 260 region is used to separate a plurality of active cell regions. Also, in an example, an N-type well region 245 is formed between the floating regions 220. For example, the well region 245 is formed to have a thickness of 6-7 um measured from the upper side of the substrate.

Such an N-type well region 245 takes on a role of inhibiting the hole carrier from moving to the N+ source region 230 from the drain metal layer or electrode 259. In an example, for this purpose, the N-type well region 245 is formed to have a higher concentration of impurities compared to the N-type drift region 240. Accordingly, when hole carriers accumulate in the drift region 140, conductivity modulation more frequently happen by the increase of the electron carriers and, as a result, resistance lowers. Therefore, the electron carriers are able to easily move into the drain region even at a small voltage, thereby achieving a low Vce (sat) characteristic.

Figure 5:
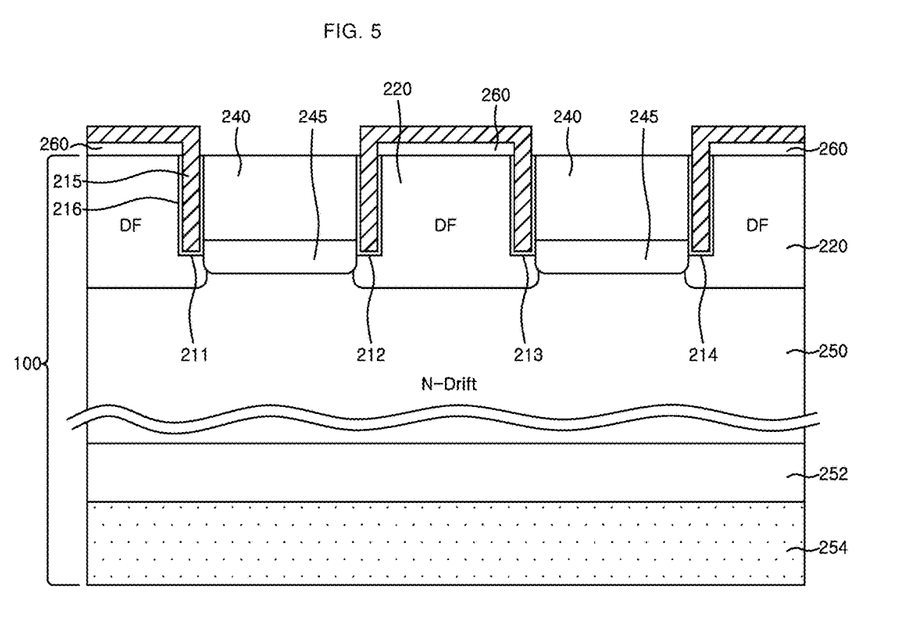

Also, as illustrated in the example of FIG. 5, trenches 211, 212, 213, and 214 are formed at a predetermined depth from the upper surface of the substrate. For example, the trenches 211, 212, 213, 214 are respectively formed to be in contact with the sides of the floating regions 220 and the well region 245. Subsequently, for convenience of explanation, the trenches are respectively referred to as the first trench 211, the second trench 212, the third trench 213, and the fourth trench 214 as left to right in the drawing. For example, the trenches, from the first trench to the fourth trench 211, 212, 213, 214 may be formed by the etching process on the semiconductor substrate, and each is formed to have an identical depth with one another through an identical process.

A gate insulating layer 216 and a gate electrode 215 are respectively formed inside of each of the trenches 211, 212, 213, 214. The gate electrode 216 is formed by depositing and patterning poly-silicon, which is a conductive material.

Sequentially, as illustrated in the example FIG. 5, photo mask patterns are formed in the substrate, and a P-type base region 240 is formed by selectively ion implantation a P-type dopant using a mask pattern within an N-type well region 245. Accordingly, the area of the N-type well region 245 is reduced. Also, an annealing process at a high temperature, such as 700° C. to 900° C., may be performed to extend the P-type base region in the downward direction of the substrate.

Figure 6:
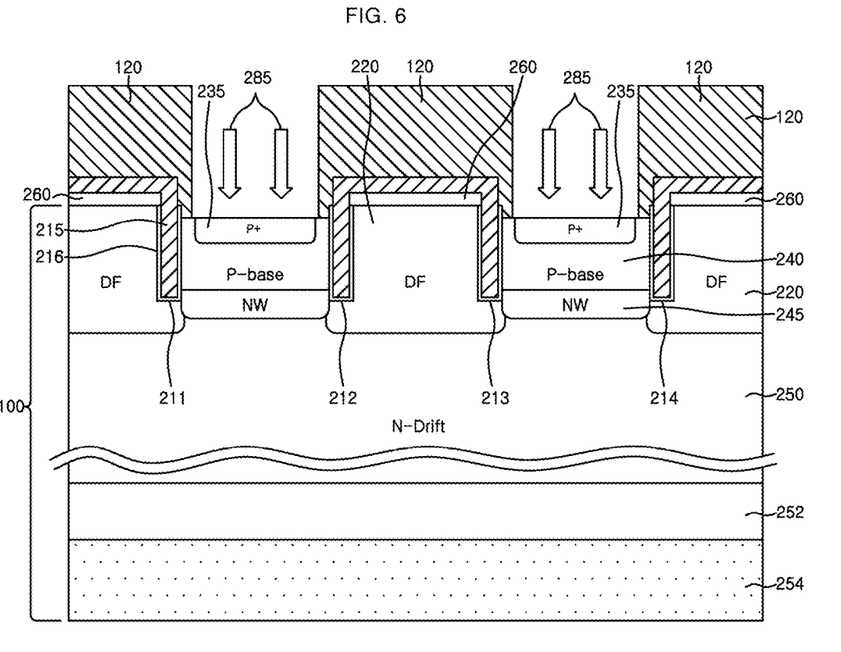

FIG. 6 shows a first implantation process using P-type dopants over the P-type base region. P+ mask patterns 120 are formed on the substrate to form P+ doped region 235. The P+ mask patterns 120 are formed on the gate electrodes 215 and accordingly the substrate is exposed. The first P+ doped region 235 are formed through a first implantation process 285 using a P-type dopant. For example, boron may be used as the P+ dopant, but other appropriate dopants are used in other examples. In an example, the ion implantation process is performed using a boron dopant at an ion implantation energy between 100-200 KeV and a dose between 1E14-1E16/$cm^2$. After forming the first P+ doped region 235, a rapid thermal process (RTP) is performed to activate the P+ dopants. Thus, RTP is one of the activation processes. In an example, RTP is performed at a high temperature, such as a temperature in a range from 850° C. to 1200° C., for 10 to 120 seconds.

Figure 7:
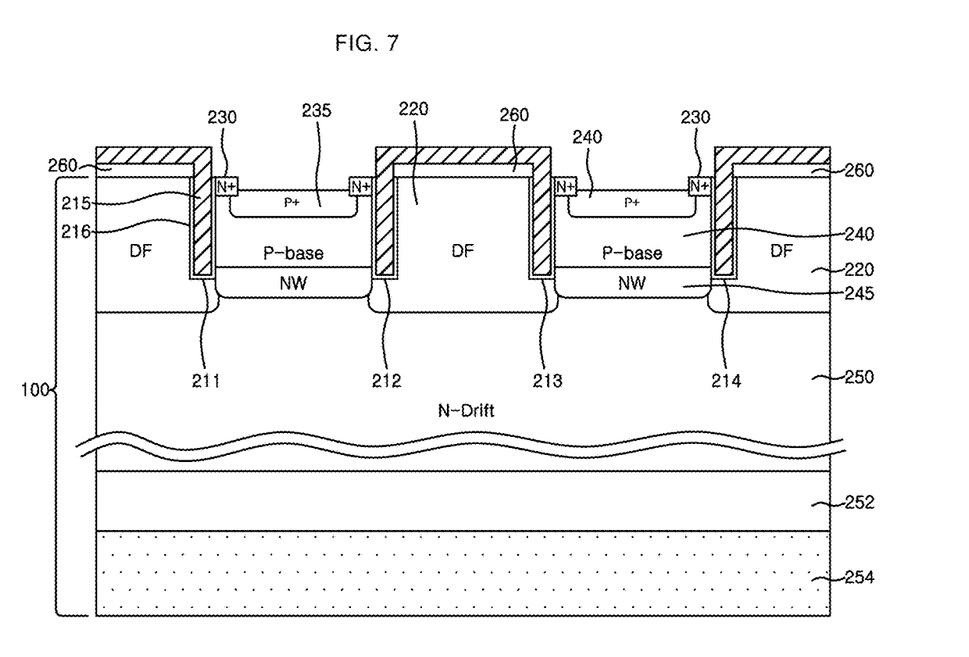

As illustrated in the example of FIG. 7, the N+ source region 230 is formed. For example, the N+ source region 230 is formed by selective ion implantation using an N-type dopant in the substrate. In such an example, a depth of the N+ source region is shallower than a depth of the first P+ doped region 235.

For example, an alternative process may have the following sequence. First, the N+ source region 230 is formed and then a P+ doped region is formed. An activation process such as RTP is applied. In that example, the N-type dopants diffuse into the P+ doped region in a large quantity. Accordingly, an area of the P+ doped region is able to be reduced. Also, in this example, enough of a safety operation area (SOA) is unable to be secured. However, as in an example of the present disclosure, when rapid thermal annealing (RTA) is performed immediately after the first implantation process, the diffusion of the N-type dopants into the P+ doped region is suppressed. By using such an approach, the P+ doped region is secured to some extent. Accordingly, a sufficient operation area is able to be secured.

Figure 8:
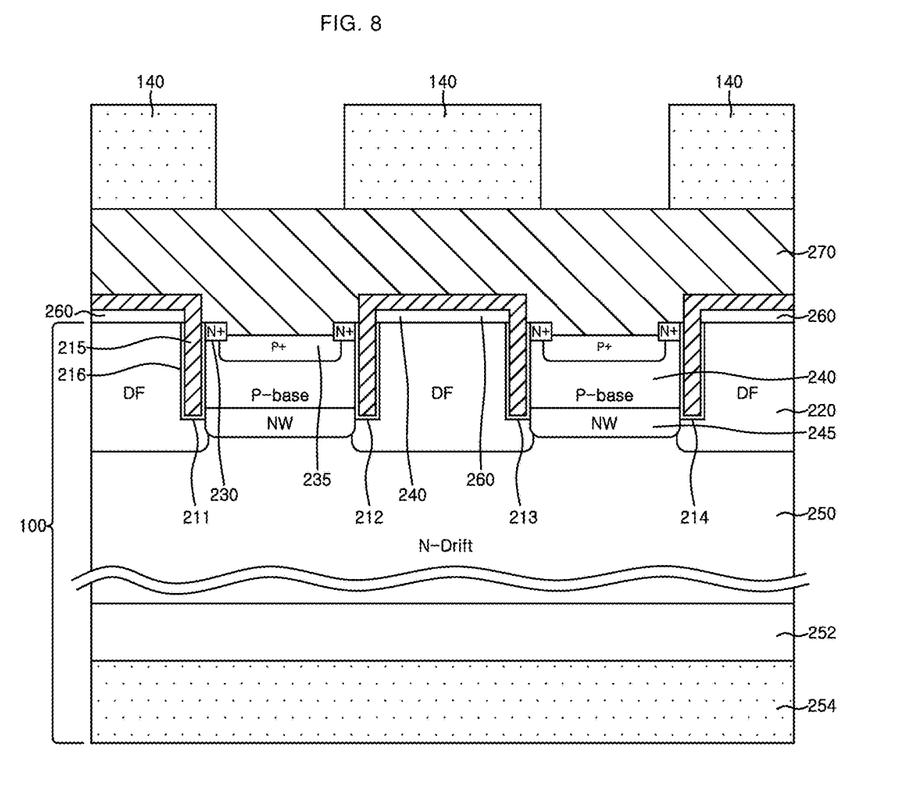

As illustrated in the example of FIG. 8, on the upper surface of the substrate, a thick interlayer insulating layer 270 is deposited by a Chemical Vapor Deposition (CVD) method. Thus, an insulating layer 270 of silicon oxide series is used as an interlayer insulating layer. For example, the insulating layer 270 may comprise stacked two layers. The first layer may be CVD oxide layer, and the second layer may be one of phosphosilicate glass (PSG) or borophosphosilicate glass (BPSG) materials. However, these are only example materials and alternative materials with similar properties are potentially used in other examples. However, the PSG or BPSG material has good flow characteristics, and therefore, the interlayer insulating layer 270 is able to be flattened. This approach is used because forming the interlayer insulating layer 270 to be flattened is necessary to form a contact mask pattern. Also, the contact mask pattern 140 is formed on the interlayer insulating layer 270. By using such a contact mask pattern 140 as a mask, a contact etching process for etching a portion of the interlayer insulating layer 270 is also performed.

FIG. 9 shows a second implantation process using P-type dopants to form a P+ doped region in the P-type base region. Through the contact etching process, an insulating layer pattern 270 is formed over the gate electrode 215. A top surface or first surface of the substrate 100, including P+ doped region 235, is exposed. Namely, the exposed substrate has a P+ doped region 235. A top portion of the P+ doped region is removed slightly during the contact etching process. Accordingly, a top portion of the first P+ doped region 235 is etched. As a result, the entire thickness of the first P+ doped region 235 becomes thinner, and the area of the P+ doped region 235 is slightly decreased. Due to this processing, the doping concentration of the P+ doped region 235 decreases.

Therefore, to compensate for the changes to the doping concentration of the P+ doped region 235, a second implantation process 295 using P-type dopants is performed as illustrated in the example of FIG. 9. The reduced amount of P-type dopant is compensated for through performing the second implantation process 295. The compensation process includes a second implantation process 295 using P-type dopants into the first P+ doped region. Accordingly, the doping concentration of the first doped region is increased. For example, the second implantation process 295 is performed using BF dopants with implantation energy less than 100 KeV and an implantation dose ranged from 1E14 to 1E16/$cm^2$. However, these are only examples and other appropriate dopants and implantation parameters may be used, as appropriate, in other examples. The dose and ion implantation energy of the second implantation process 295 are small as compared to the first implantation process 285. Therefore, it is possible to state that a second P+ doped region is formed in the first P+ doped region by a second implantation process 295.

Also, an annealing process is performed at a temperature below 900° C. after the second implantation process. Such an annealing process cures etch damage of the substrate caused by the contact etching process. Diffusion of N+ dopants is negligible during this annealing process.

As illustrated in the example of FIG. 10, an emitter electrode 280 is formed on the insulating layer pattern 270 and a substrate 100 using a metallic material such as aluminum (Al), copper (Cu), or an Al/Cu alloy. However, these are only examples and other appropriate metallic materials with similar properties are used in other examples. The emitter electrode 280 and the gate electrode 215 are electrically separated from each other by the presence of the insulating layer pattern 270. The N+ source region 230 and the P+ doped region 235 are electrically connected to the emitter electrode 280.

Furthermore, a passivation layer 290 is formed in order to prevent moisture and other potentially detrimental material from penetrating into the semiconductor device after forming the emitter electrode. Also, a backside grinding process is performed on the back side or second surface of the substrate. Through the backside grinding process, a base substrate 254 is eliminated. When the base substrate 254 is eliminated, the backside grinding process is performed until the first epitaxial-layer 252 is exposed. The remaining first epitaxial-layer 252 becomes an N+ field stop layer 255 as a result. Therefore, there is an attendant advantage of this example that a separate ion implantation process for forming the N+ field stop layer 255 is not necessary.

The field stop layer 255 acts to prevent the electric field formed from the emitter electrode from extending further to the P+ collector layer 257. In the absence of the field stop layer 255, the thickness of the drift region 250 must be made to be very thick, in which case the resistance is increased by the presence of a drift region 250 doped with a low concentration of dopant. Also, in the absence of the field stop layer 255, the electric field is formed to extend deeper downward and the PN diode is unable to be formed, so that the IGBT function used for a high-capacity current is unable to be exhibited properly.

Next, a P+ collector layer 257 is formed. Finally, a power semi-conductor device is completed by depositing a drain electrode 259.

Figure 11:
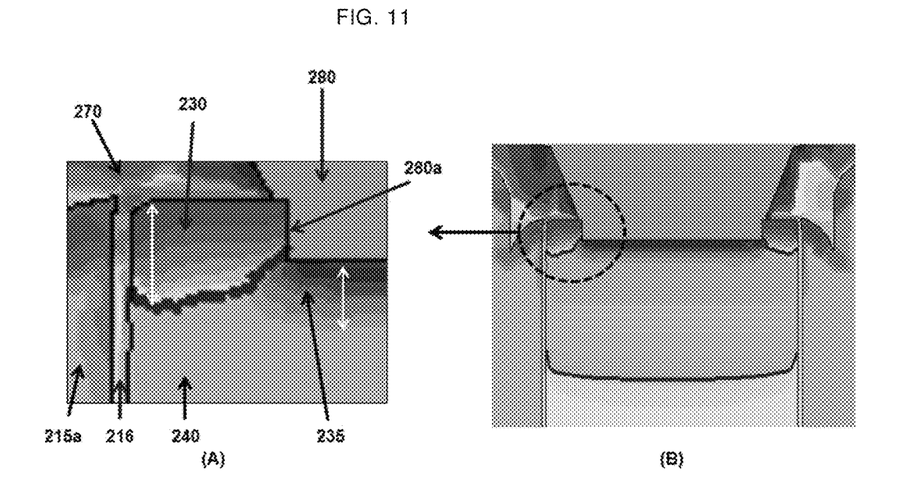
FIG. 11 is a result of a device simulation of a power semiconductor device manufactured by alternative technology.
Figure 12:
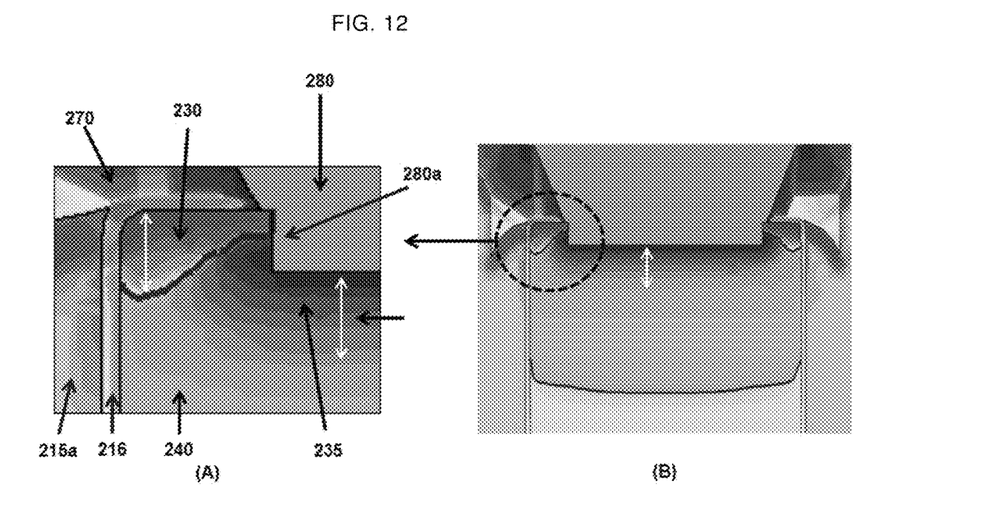
FIG. 12 is a result of a device simulation of a power semiconductor according to an example.

FIGS. 11 and 12 are device simulation results shown to explain and illustrate the difference between the alternative technology and the present examples. FIG. 11 illustrates an example of being manufactured by an alternative process, and FIG. 12 corresponds to an example.

When the manufacturing process is performed by an alternative process, as shown in FIG. 11 at (A) and (B), the arrows shown in FIG. 11 are formed to be deeper in the N+ source region 230 than the P+ doped region 235. In particular, the P+ doped region 235 is formed to be shallower. Also, it can be observed that sidewall 280a of the emitter electrode 280 mainly is in contact with the N+ source region 230. Because the concentration of the N-type dopants is locally greater than that of the P-type dopants at the bottom corner of the emitter electrode, the boron is displaced by phosphorous, which is an N-type dopant. The N-type dopants diffuse toward to the bottom corner of the emitter contact electrode. Therefore, it may be impossible to obtain a Reverse Bias Safety Operation Area (RBSOA) in the reverse bias state in the alternative technology due to its vulnerability to the dynamic latch-up. The RBSOA parameter is relevant to testing stable operating conditions in the turn-off state in the IGBT device.

However, in the present examples, as illustrated in FIG. 12 at (A) and (B), the N+ source region 230 is formed to be shallower than the P+ doped region 235. Accordingly, a desirable P+ doped region 235 is secured. A portion of the P+ doped region contacting the sidewall of the emitter electrode is larger than a portion of the N+ source region contacting the sidewall of the emitter electrode. It can be seen in the example of FIG. 12 that the N+ source region 230 and the P+ doped region 235 simultaneously contact the sidewall 280a of the emitter electrode 280. After activating the P+ type dopant followed by the N+ type dopant, a stable P+ region is secured at the bottom corner of the emitter contact 280. Therefore, dynamic latch-up performance is improved. Also, five times an RBSOA level is able to be secured. As a result of an SOA test, good results were obtained under all evaluation conditions, and no significant difference was noted for the various RTP conditions.

Figure 13:
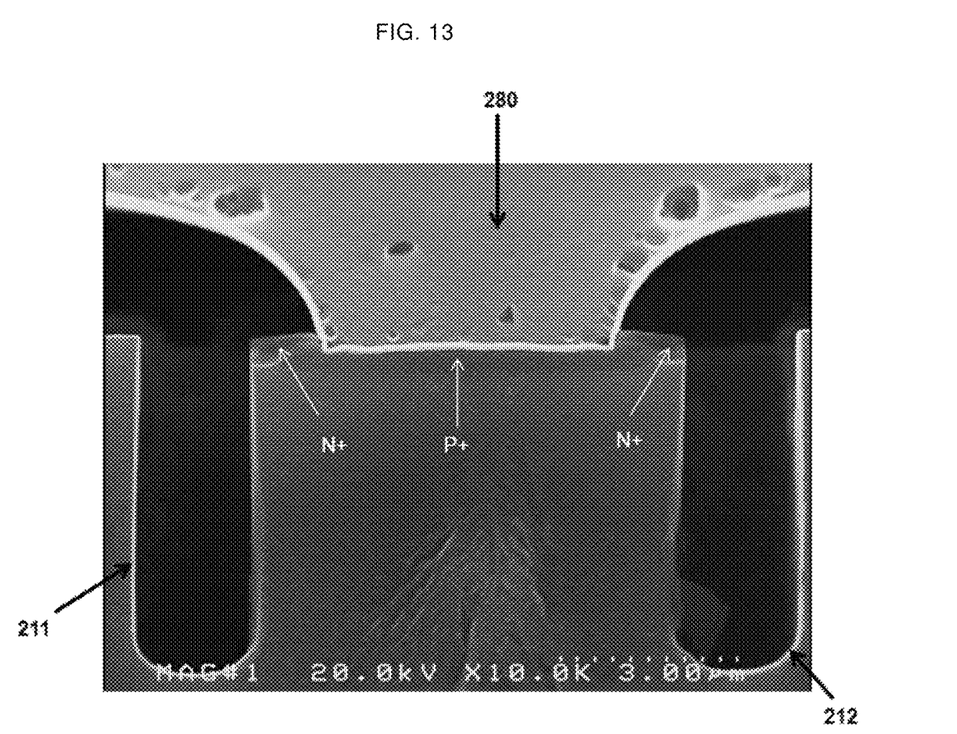
FIG. 13 is a Scanning Electron Microscope (SEM) picture of a power semiconductor according to an example.

FIG. 13 is an SEM picture of a power semiconductor according to an example. As illustrated in the drawing, N+ source region and P+ doped region are clearly illustrated. It may also be seen that the SEM picture is almost identical to the result of device simulation.

The method of manufacturing a power semiconductor device according to the present examples provides a method of manufacturing a power semiconductor device capable of securing a P+ doped region with a desired design and providing a wide RBSOA window, through the above technical construction.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A method of manufacturing a power semiconductor device, comprising:
    forming trenches in a substrate, wherein the substrate comprises a first surface and a second surface opposite to the first surface;
    forming a gate insulating layer and a gate electrode in each of the trenches;
    forming a P-type base region between the trenches in the substrate;
    performing a first implantation process using P-type dopants implanted onto the P-type base region;
    forming an N+ source region in the substrate;
    forming an interlayer insulating layer on the N+ source region;
    performing a second implantation process using P-type dopants to form a P+ doped region on the P-type base region;
    forming an emitter electrode in contact with the N+ source region and the P+ doped region;
    forming a P-type collector region on the second surface of the substrate; and
    forming a drain electrode on the P-type collector region.

2. The method of manufacturing a power semiconductor device of claim 1, further comprising:
    forming a floating region in the substrate, wherein the floating region has a depth deeper than a depth of the P-type base region.

3. The method of manufacturing a power semiconductor device of claim 1, wherein the substrate comprises a high-concentration first epitaxial-layer and a low-concentration second epitaxial-layer.

4. The method of manufacturing a power semiconductor device of claim 1, wherein the P+ doped region has a greater depth than a depth of the N+ source region.

5. The method of manufacturing a power semiconductor device of claim 1, wherein the N+ source region and the P+ doped region each contact a vertical sidewall of the emitter electrode.

6. The method of manufacturing a power semiconductor device of claim 1, further comprising:
    performing a rapid thermal process after performing the first implantation process; and
    performing a grinding process on the second surface of the substrate, before forming the collector region.

7. The method of manufacturing a power semiconductor device of claim 1, wherein an ion implantation energy of the first implantation process is greater than an ion implantation energy of the second implantation process.

8. The method of manufacturing a power semiconductor device of claim 1, wherein a dose amount of the second implantation process is smaller than a dose amount of the first implantation process.

9. The method of manufacturing a power semiconductor device of claim 1, wherein the interlayer insulating layer comprises two stacked layers.

10. The method of manufacturing a power semiconductor device of claim 9, wherein a first layer of the interlayer insulating layer is a Chemical Vapor Deposition (CVD) oxide layer, and a second layer of the interlayer insulating layer is one of phosphosilicate glass (PSG) and borophosphosilicate glass (BPSG).

11. The method of manufacturing a power semiconductor device of claim 1, wherein the emitter electrode is formed of aluminum (Al), copper (Cu), or an aluminum/copper (Al/Cu) alloy.

12. The method of manufacturing a power semiconductor device of claim 1, wherein the second implantation process performs using the interlay insulating layer as a mask pattern.

13. A method of manufacturing a power semiconductor device, comprising:
    forming trenches in a substrate comprising a first surface and a second surface opposite to the first surface;
    forming a gate insulating layer and a gate electrode in each of the trenches;
    forming a P-type base region in the substrate;
    forming a P+ doped region and an N+ source region in the P-type base region;
    forming an interlayer insulating layer on the P+ doped region and the N+ source region;
    forming an interlayer insulating layer pattern on the gate electrode, and subsequently performing a compensation process;
    forming an emitter electrode contacting the N+ source region;
    forming a collector region on the second surface of the substrate; and
    forming a drain electrode on the collector region.

14. The method of manufacturing a power semiconductor device of claim 13, further comprising:
    performing a rapid thermal process after forming the P+ doped region.

15. The method of manufacturing a power semiconductor device of claim 13, wherein the compensation process comprises performing an implantation process, using P-type dopants, into the P+ doped region.

16. The method of manufacturing power semiconductor device of claim 15, wherein a portion of the P+ doped region contacting a vertical sidewall of the emitter electrode is larger than a portion of the N+ source region contacting the vertical sidewall of the emitter electrode.

17. The method of manufacturing a power semiconductor device of claim 13, wherein the interlayer insulating layer comprises two stacked layers.

18. The method of manufacturing a power semiconductor device of claim 17, wherein a first layer of the interlayer insulating layer is a Chemical Vapor Deposition (CVD) oxide layer, and a second layer of the interlayer insulating layer is one of phosphosilicate glass (PSG) and borophosphosilicate glass (BPSG).

19. The method of manufacturing a power semiconductor device of claim 13, wherein the emitter electrode is formed of aluminum (Al), copper (Cu), or an aluminum/copper (Al/Cu) alloy.

20. The method of manufacturing a power semiconductor device of claim 13, wherein the compensation process performs ion implantation using the interlay insulating layer pattern as a mask pattern.

* * * * *